United States Patent
Yokota et al.

(10) Patent No.: US 7,037,586 B2
(45) Date of Patent: *May 2, 2006

(54) FILM FOR CIRCUIT BOARD

(75) Inventors: Tadahiko Yokota, Kawasaki (JP); Shigeo Nakamura, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/754,618

(22) Filed: Jan. 12, 2004

(65) Prior Publication Data
US 2004/0142155 A1    Jul. 22, 2004

Related U.S. Application Data

(63) Continuation of application No. PCT/JP02/07097, filed on Jul. 12, 2002.

(30) Foreign Application Priority Data
Jul. 18, 2001   (JP)   ............................. 2001-218279

(51) Int. Cl.
*B32B 15/00* (2006.01)
*B32B 27/38* (2006.01)
*C08L 63/00* (2006.01)

(52) U.S. Cl. ............. 428/416; 428/336; 428/344; 428/355 R; 428/413; 428/414; 428/418; 428/901; 427/307; 427/386; 523/427; 523/428; 523/433; 523/435

(58) Field of Classification Search ............ 428/209, 428/413–418, 336, 344, 355 R, 901; 174/258–259; 427/307, 386; 523/427, 428, 433, 435
See application file for complete search history.

(56) References Cited

U.S. PATENT DOCUMENTS

| 6,124,023 A * | 9/2000 | Furuta et al. ............... 428/172 |
| 6,403,221 B1 * | 6/2002 | Nakamura et al. .......... 428/416 |
| 6,805,958 B1 * | 10/2004 | Nakamura et al. .......... 428/416 |

FOREIGN PATENT DOCUMENTS

CN    1293218 A    5/2001

* cited by examiner

*Primary Examiner*—Cathy F. Lam
(74) *Attorney, Agent, or Firm*—Oblon, Spivak, McClelland, Maier & Neustadt, P.C.

(57) ABSTRACT

The present invention relates to a film for a circuit board characterized in that the following A layer is adjacent to the following B layer is disclosed in the present application. A circuit board excellent in adhesion strength of a conductor layer can easily be produced by using this film.

A layer: a heat-resistant resin layer with a thickness of from 2 to 250 μm which layer is made of a heat-resistant resin having a glass transition point of 200° C. or more or a decomposition temperature of 300° C. or more, and B layer: a roughenable cured resin layer with a thickness of from 5 to 20 μm which layer is made of a cured product of a thermosetting resin composition containing at least component (a) of an epoxy resin having two or more epoxy groups in a molecule and component (b) of an epoxy curing agent, the cured product being capable of roughening with an oxidizing agent.

22 Claims, 3 Drawing Sheets

FILM FOR CIRCUIT BOARD

CONTINUING APPLICATION DATA

This application is a continuation of international application No. PCT/JP02/07097, filed on Jul. 12, 2002, which claims priority to Japanese application No. 2001-218279, filed on Jul. 18, 2001. Both of those applications are incorporated herein by reference.

BACKGROUND OF THE INVENTION

1. Field of the Invention

The present invention relates to a film for a circuit board, especially a film for a circuit board which can be utilized in an electronic circuit and the like of portable devices such as a cellular phone, PDA (personal digital assistant), a notebook personal computer and the like, particularly a film suitable for a flexible circuit board.

2. Description of the Background

A polyimide resin film, a liquid crystal polymer film, an aramid resin film, a polyether ether ketone film and the like have found wide acceptance as insulation materials of electronic devices and the like because they are excellent in heat resistance, dimensional stability, solvent resistance and electrical and mechanical properties. Especially, a product in which a conductor layer is formed on a polyimide resin film has been often used in a flexible printed circuit board (FPC) of tape automated bonding (TAB) or the like.

With respect to a method in which a conductor layer is formed on a polyimide resin film, a laminating method in which a polyimide resin film and a copper foil are adhered with an adhesive (thermosetting resin composition) has been the most commonly used procedure. However, in a film for a board with a copper foil which is produced by this method, a hole formation step in forming a circuit is complicated. For example, when through-hole formation for connecting circuits formed on both surfaces of a film for a board is performed with a laser, it is required that a step of hole formation of copper foils on both surfaces through etching is first conducted and an insulation layer portion is then drilled with a laser. Further, in the laminating method, a copper foil having a certain thickness of, for example, 35 μm, 18 μm or 12 μm is used. There are problems that as the thickness is increased, formation of a fine circuit by a subtractive method is difficult, whereas when the thickness is decreased, the cost is increased. Especially, when an inner wall of a through-hole is plated, the thickness is increased by plating a copper foil as well, which is disadvantageous for formation of a fine circuit.

In order to solve these problems, a method in which a metallic layer as a base is directly formed on a polyimide resin film by a dry process such as sputtering or deposition and a conductor layer is then formed by electroless copper plating and further by electroplating copper (JP-A-2001-77493 and JP-A-9-136378) and a method in which a polyimide resin film is directly plated to form a conductor layer (JP-A-8-31881 and JP-A-7-243049) have been attempted. The former requires formation of a metallic layer of cobalt, nickel or chromium as a base by a dry metalizing method such as sputtering or vacuum deposition for improving adhesion between the polyimide resin film and the conductor layer. Thus, the step is complicated, and it is difficult to prevent generation of pinholes. Further, the latter also requires a step of electroless nickel plating or the like prior to electroless copper plating or electroplating copper step in addition to special hydrophilic treatment on the surface of the polyimide resin film. Thus, the step is complicated, and the adhesion strength is not necessarily satisfactory.

SUMMARY OF THE INVENTION

It is an object of the present invention to provide a film for which can be used for producing a circuit board excellent in adhesion strength of a conductor layer, and further a film for a circuit board appropriate for formation of a fine printed circuit.

The present inventors have assiduously conducted investigations for solving the foregoing problems, and have consequently found that a circuit board with a conductor layer having excellent adhesion can readily be produced from a film in which a specific roughenable cured resin layer is formed on a heat-resistant resin layer of a specific polyimide resin, liquid crystal polymer or the like through a general-purpose process of roughening, electroless copper plating and electroplating copper, and further that the film becomes a film suitable for a circuit board that allows formation of a fine printed circuit. The present invention has been completed on the basis of such findings.

That is, the invention provides a film for a circuit board characterized in that the following A layer is adjacent to the following B layer.

A layer: a heat-resistant resin layer with a thickness of from 2 to 250 μm which layer is made of a heat-resistant resin having a glass transition point of 200° C. or more or a decomposition temperature of 300° C. or more, and B layer: a roughenable cured resin layer with a thickness of from 5 to 20 μm which layer is made of a cured product of a thermosetting resin composition containing at least component (a) of an epoxy resin having two or more epoxy groups in a molecule and component (b) of an epoxy curing agent, the cured product being capable of roughening with an oxidizing agent.

The present invention also provides a film for a circuit board, where the film comprises the following A layer, B layer and C layer, and has a layer structure in the order of C layer, B layer and A layer, where the A layer is a heat-resistant resin layer with a thickness of from 2 to 250 μm which is made of a heat-resistant resin having a glass transition point of 200° C. or more or a decomposition temperature of 300° C. or more, the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, and the C layer is a peelable support film.

The present invention also provides a film for a circuit board, where the film comprises the following A layer, B layer and D layer, and has a layer structure in the order of D layer, B layer and A layer, where the A layer is a heat-resistant resin layer with a thickness of from 2 to 250 μm which is made of a heat-resistant resin having a glass transition point of 200° C. or more or a decomposition temperature of 300° C. or more, the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, and the D layer is a conductor layer.

The present invention also provides a film for a circuit board, where the film comprises the following A layer, B layer and C layer, and has a layer structure in the order of C layer, B layer, A layer, B layer and C layer, where the A layer is a heat-resistant resin layer with a thickness of from 2 to 250 μm which is made of a heat-resistant resin having a glass transition point of 200° C. or more or a decomposition temperature of 300° C. or more, the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, and the C layer is a peelable support film.

The present invention also provides a film for a circuit board, where the film comprises the following A layer, B layer and D layer and has a layer structure in the order of D layer, B layer, A layer, B layer and D layer, where the A layer is a heat-resistant resin layer with a thickness of from 2 to 250 μm which is made of a heat-resistant resin having a glass transition point of 200° C. or more or a decomposition temperature of 300° C. or more, the B layer is a roughenable cured resin layer with a thickness of from 5 to 20 μm which layer is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, and the D layer is a conductor layer.

The present invention also provides a film for a circuit board, where the film comprises the following A layer, B layer, C layer, E layer and F layer, and has a layer structure in the order of C layer, B layer, A layer, E layer and F layer, where the A layer is a heat-resistant resin layer with a thickness of from 2 to 250 μm which is made of a heat-resistant resin having a glass transition point of 200° C. or more or a decomposition temperature of 300° C. or more, the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, the C layer is a peelable support film, the E layer is a cured resin layer with a thickness of from 5 to 20 μm which is made of a cured product of a thermosetting resin composition containing at least component (a) of an epoxy resin having two or more epoxy groups in a molecule and component (b) of an epoxy curing agent, and the F layer is a copper foil.

The present invention also provides a film for a circuit board, where the film comprises the following A layer, B layer, D layer, E layer and F layer, and has a layer structure in the order of D layer, B layer, A layer, E layer and F layer, where the A layer is a heat-resistant resin layer with a thickness of from 2 to 250 μm which is made of a heat-resistant resin having a glass transition point of 200° C. or more or a decomposition temperature of 300° C. or more, the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, the D layer is a conductor layer, the E layer is a cured resin layer with a thickness of from 5 to 20 μm which is made of a cured product of a thermosetting resin composition containing at least component (a) of an epoxy resin having two or more epoxy groups in a molecule and component (b) of an epoxy curing agent, and the F layer is a copper foil.

The present invention also provides a method of making a circuit board, comprising:

roughening the roughenable cured resin layer (the B layer) of the film as described above, and forming a conductor layer on the resulting roughened roughenable cured resin layer.

A more complete appreciation of the invention and many of the attendant advantages thereof will be readily obtained as the same becomes better understood by reference to the following Figures in conjunction with the detailed description below.

DETAILED DESCRIPTION OF THE INVENTION

Figure 1:
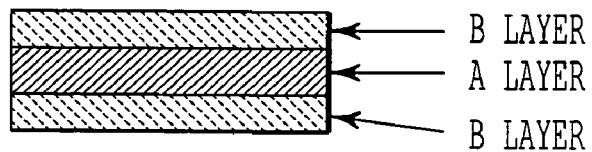
FIG. 1 shows a layer structure of roughenable cured resin layer (B layer)/heat-resistant resin layer (A layer)/roughenable cured resin layer (B layer).
Figure 2:
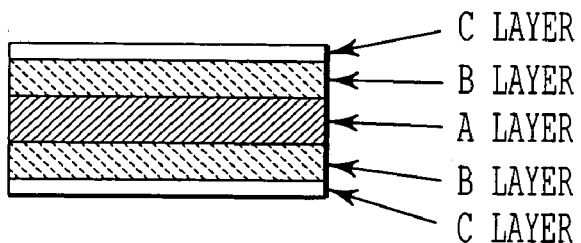
FIG. 2 shows a layer structure of peelable support film layer (C layer)/roughenable cured resin layer (B layer)/heat-resistant resin layer (A layer)/roughenable cured resin layer (B layer)/peelable support film layer (C layer).
Figure 3:
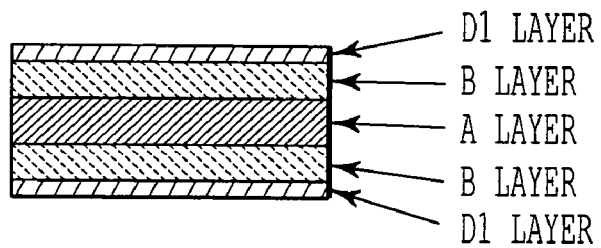
FIG. 3 shows a layer structure example of electroless copper-plated layer (D1 layer)/roughenable cured resin layer (B layer)/heat-resistant resin layer (A layer)/roughenable cured resin layer (B layer)/electroless copper-plated layer (D1 layer).
Figure 4:
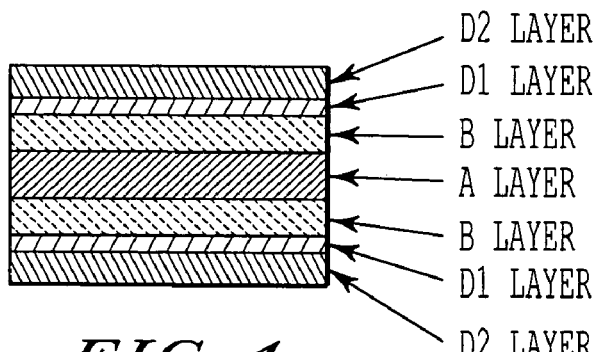
FIG. 4 shows a layer structure of copper-electroplated layer (D2 layer)/electroless copper-plated layer (D1 layer)/roughenable cured resin layer (B layer)/heat-resistant resin layer (A layer)/roughenable cured resin layer (B layer)/electroless copper-plated layer (D1 layer/copper-electroplated layer (D2 layer).
Figure 5:
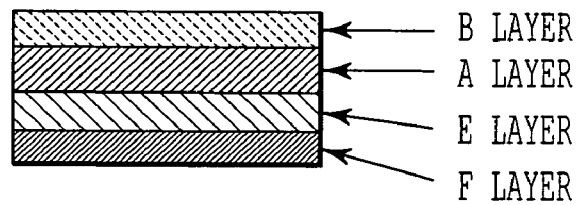
FIG. 5 shows a layer structure of roughenable cured resin layer (B layer)/heat-resistant resin layer (A layer)/cured resin layer (E layer)/copper foil (F layer).
Figure 6:
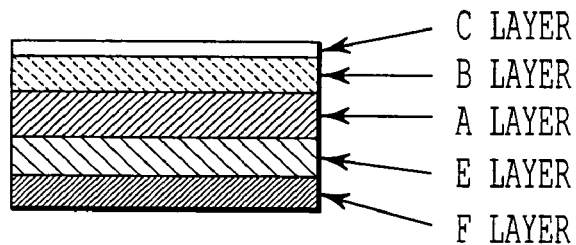
FIG. 6 shows a layer structure of peelable support film layer (C layer)/roughenable cured resin layer (B layer)/heat-resistant resin layer (A layer)/cured resin layer (E layer)/copper foil (F layer).
Figure 7:
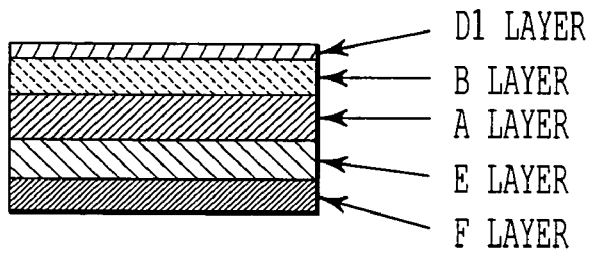
FIG. 7 shows a layer structure of electroless copper-plated layer (D1 layer)/roughenable cured resin layer (B layer)/heat-resistant resin layer (A layer)/cured resin layer (E layer)/copper foil (F layer).
Figure 8:
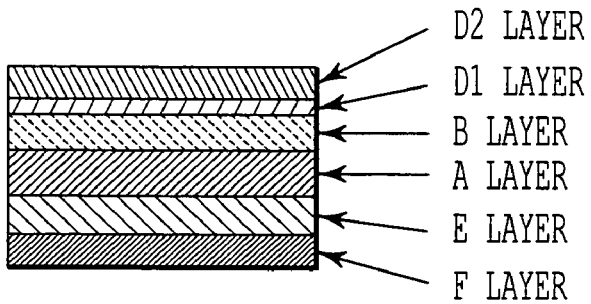
FIG. 8 shows a layer structure of copper-electroplated layer (D2 layer)/electroless copper-plated layer (D1 layer)/roughenable cured resin layer (B layer)/heat-resistant resin layer (A layer)/cured resin layer (E layer)/copper foil (F layer).
Figure 9:
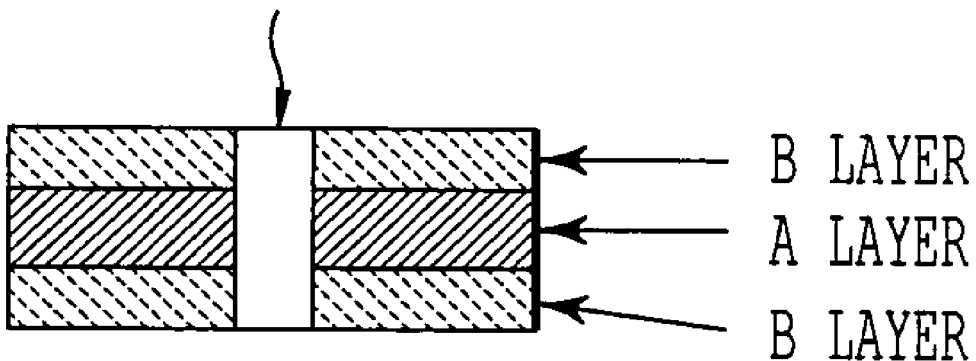
FIG. 9 is a conceptional view when a via hole is formed in a film for a circuit board having the layer structure shown in FIG. 1.
Figure 10:
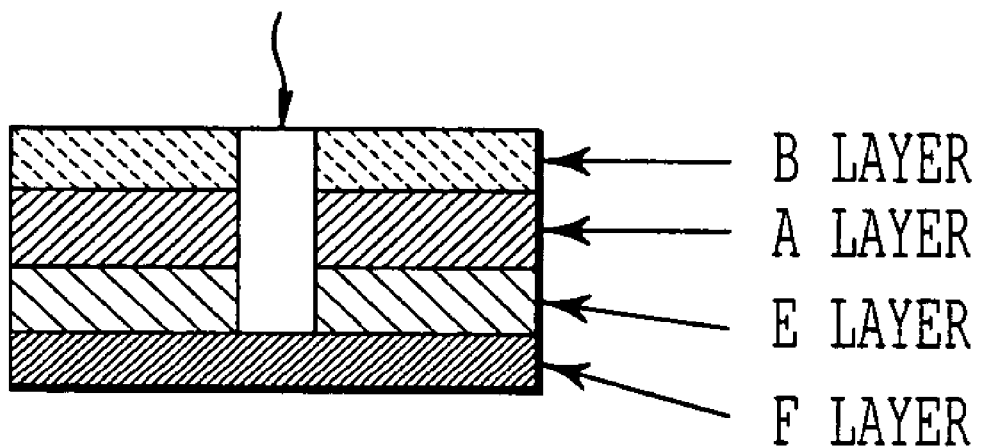
FIG. 10 is a conceptional view when a blind via is formed in a film for a circuit board having the layer structure shown in FIG. 5.

The film for a circuit board in the invention has "a heat-resistant resin layer with a thickness of from 2 to 250 µm which layer is made of a heat-resistant resin having a glass transition point of 200° C. or more or a decomposition temperature of 300° C. or more" (which is sometimes abbreviated as "A layer" or "heat-resistant resin layer" herein).

The heat-resistant resin used in the invention has a glass transition point of 200° C. or more or a decomposition temperature of 300° C. or more which satisfies heat resistance in soldering required in the production of a multilayer printed wiring board. Here, the decomposition temperature is defined in terms of a temperature at which a weight reduction rate becomes 5% when measured according to JIS (Japanese Industrial Standards) K7120 (gravimetry of plastics), incorporated herein by reference.

The heat-resistant resin comprising the heat-resistant resin layer is preferably selected from a polyimide resin, a liquid crystal polymer, an aramid resin and a polyether ether ketone. Especially, a polyimide resin is preferable. Incidentally, as the liquid crystal polymer, a liquid crystal polymer which is structurally a wholly aromatic polyester is preferably used.

When the thickness of the heat-resistant resin layer is less than 2 µm, the mechanical strength of an insulation layer or a multilayer printed wiring board might be insufficient. When it exceeds 250 µm, the cost is increased, and the thickness of the insulation layer becomes more than as required. Thus, these are undesirable. As a layer for a flexible printed circuit board, a layer having a thickness of from 2 to 75 µm is ordinarily used. A layer having a thickness of from 75 to 250 µm is suitable for use in, for example, an interposer of CSP (chip-size package).

In the heat-resistant resin layer in the film for a circuit board of the invention, a heat-resistant resin marketed in the form of a film can be used. For example, heat-resistant resin films such as a polyimide film "Upilex-S" manufactured by Ube Industries, Ltd., a polyimide film "Kapton" manufactured by Du Pont-Toray Co., Ltd., a polyimide film "Apical" manufactured by Kaneka Corporation, an aramid film "Aramica" manufactured by Asahi Kasei Corporation, an aramid film "Mictron" manufactured by Toray Industries Inc., a liquid crystal polymer film "Vecstar" manufactured by Kuraray Co., Ltd. and a polyether ether ketone film "Sumilite FS-1100C" manufactured by Sumitomo Bakelite Co., Ltd. are available.

As the heat-resistant resin layer (A layer), a surface-treated layer may be used. Examples of the surface treatment include dry treatments such as corona discharge, plasma treatment and ion beam treatment, chemical treatments with a solvent, an acid and an alkali, mechanical polishing and the like. Especially in view of adhesion with B layer, it is preferable to apply plasma treatment.

The film for a circuit board in the invention has also "a roughenable cured resin layer with a thickness of from 5 to 20 µm which layer is made of a cured product of a thermosetting resin composition containing at least component (a) of an epoxy resin having two or more epoxy groups in a molecule and component (b) of an epoxy curing agent, the cured product being capable of roughening with an oxidizing agent" (which is sometimes abbreviated as B layer or "roughenable cured resin layer" herein). This is described below.

As the "epoxy resin having two or more epoxy groups in a molecule" as component (a), an aromatic epoxy resin having an aromatic ring structure in a molecule is preferably used for increasing the heat resistance. Examples thereof can include epoxy resins having two or more epoxy groups in a molecule, such as a bisphenol A-type epoxy resin, a bisphenol F-type epoxy resin, a phenolic novolak-type epoxy resin, a bisphenol S-type epoxy resin, an alkylphenolic novolak-type epoxy resin, a biphenol-type epoxy resin, a naphthalene-type epoxy resin, an epoxy compound of a condensate of a phenol and an aromatic aldehyde having a phenolic hydroxyl group, and the like. Further, the epoxy resin may be brominated or the like for imparting fire retardance.

Examples of the "epoxy curing agent" as component (b) can include an amine-type curing agent, a guanidine-type curing agent, an imidazole-type curing agent, a phenolic curing agent, an acid anhydride-type curing agent, epoxy adducts or microcapsules thereof, and the like. Further, with respect to the curing agents, those having a longer pot life are preferable. Two or more of the epoxy curing agents can also be used in combination.

Specific examples of the epoxy curing agents can include dicyandiamide, 2-phenyl-4-methyl-5-hydroxymethylimidazole, 2-phenyl-4,5-bis(hydroxymethyl)imidazole, 2,4-diamino-6-(2-methyl-1-imidazolylethyl)-1,3,5-triazine-isocyanuric acid adduct, 2,4-diamino-6-(2-undecyl-1-imidazolylethyl)-1,3,5-triazine and the like.

As the epoxy curing agent, the phenolic curing agent having a nitrogen atom is especially preferable. The use of the phenolic curing agent having the nitrogen atom is effective for improving heat resistance, fire retardance and adhesion of the insulation layer. Examples of such an epoxy curing agent can include a triazine structure-containing novolak resin (for example, "Phenolite 7050 Series" manufactured by Dainippon Ink and Chemicals, Inc.) and a melamine-modified phenolic novolak resin (for example, "YLH 828" manufactured by Japan Epoxy Resins Co., Ltd.).

These epoxy curing agents in the thermosetting resin composition can ordinarily be used in the range of from 2 to 12% by weight in case of the amine-type curing agent, guanidine-type curing agent and imidazole-type curing agent, and ordinarily in the range of from 0.5 to 1.3 equivalents per equivalent of the epoxy group of the epoxy resin contained in the thermosetting resin composition in terms of a phenolic hydroxyl group equivalent or an acid anhydride equivalent.

Besides the epoxy curing agent, a curing accelerator can also be added. Examples of the curing accelerator include an imidazole-type compound, an organic phosphine-type compound and the like. In case of using the curing accelerator, it can preferably be used in the range of from 0.5 to 2% by weight based on the epoxy resin contained in the thermosetting resin composition.

As the thermosetting resin composition which is a material of the roughenable cured resin layer in the film for a circuit board in the invention, it is preferable to use a composition having a glass transition point of 150° C. or more. This can easily be prepared by a skilled person upon using, for example, an aromatic epoxy resin, having an aromatic ring structure in a molecule (a) or upon further using a phenolic curing agent having a nitrogen atom as component (b).

In the thermosetting resin composition in the invention, the surface of the cured product can be roughened with an oxidizing agent after heat curing. A conductor layer excellent in peel strength can easily be formed by roughening and plating the surface of the cured product.

In order to be able to roughen the surface of the thus-cured resin composition, a roughening component may be contained in the thermosetting resin composition. When the thermosetting resin composition in the invention uses a phenolic curing agent as an epoxy curing agent (component (b)) and contains a phenoxy resin having a bisphenol S structure and a weight average molecular weight of from 5,000 to 100,000, roughening with an oxidizing agent is possible without containing a roughening component in particular.

Examples of the roughening component can include a rubber component, an amino resin, an inorganic filler, an organic filler and the like.

Examples of the rubber component can include a polybutadiene rubber, an epoxy-modified polybutadiene rubber, a urethane-modified polybutadiene rubber, an acrylonitrile-modified polybutadiene rubber, a methacrylonitrile-modified polybutadiene rubber, a carboxyl group-containing acrylonitrile-butadiene rubber, a carboxyl group-containing methacrylonitrile-butadiene rubber, an acrylic rubber-dispersed epoxy resin and the like.

Examples of the amino resin can include amino resins such as a melamine resin, a guanamine resin and a urea resin, these amino acids which are alkyl-etherified, and the like. Examples of the inorganic filler include calcium carbonate, magnesium carbonate, magnesium oxide, aluminum hydroxide and the like.

And, examples of the organic filler can include an epoxy resin powder, a crosslinked acrylic polymer, the foregoing amino resins which are heat-cured and pulverized, and the like. When the thermosetting resin composition according to the invention contains the roughening component, the proportion of the roughening component is preferably from 5 to 40% by weight, more preferably from 10 to 30% by weight. When it is less than 5% by weight, the roughening might be insufficient. Meanwhile, when it exceeds 40% by weight, the insulating property, chemical resistance and heat resistance of the insulation layer after curing tend to decrease.

Examples of a phenoxy resin having a weight average molecular weight of from 5,000 to 100,000 can include phenoxy resins such as "Phenotohto YP50" (manufactured by Tohto Kasei Co., Ltd.) and "E-1256T" (manufactured by Japan Epoxy Resins Co., Ltd.), and brominated phenoxy resins such as "YY13-40-PXM40" (manufactured by Tohto Kasei Co., Ltd.). Further, examples of a phenoxy resin with a bisphenol S structure having a weight. average molecular weight of from 5,000 to 10,000 can include "YL6747H30" (manufactured by Japan Epoxy Resins Co., Ltd., a cyclohexanone varnish of a phenoxy resin made of a bisphenol A-type epoxy resin "Epikote 828" and bisphenol S: nonvolatile component 30% by weight, weight average molecular weight 47,000), "YL6746H30" (manufactured by Japan Epoxy Resins Co., Ltd., a cyclohexanone varnish of a phenoxy resin made of a bixylenol-type epoxy resin "Epikote YX4000" and bisphenol S: nonvolatile content 30% by weight, weight average molecular weight 40,000), and the like. It is preferable that such a phenoxy resin is contained in the thermosetting resin composition in an amount of from 5 to 50% by weight.

The thermosetting resin composition can also contain an inorganic filler other than the inorganic filler used as the roughening component for imparting various functions. Examples of the inorganic filler used as the additive can include barium sulfate, barium titanate, silicon oxide powder, amorphous silica, talc, clay, mica powder and the like. These inorganic fillers other than the roughening component can be used in the thermosetting resin composition in the range of from 10 to 80% by weight.

Further, the thermosetting resin composition of the invention can contain other various resin additives which are customarily used in this field, if necessary. Examples of such additives include a thickening agent, a defoamer, a leveling agent, an adhesion-imparting agent, a colorant, a flame retardant adjuvant, an inorganic filler, an organic filler and the like.

With respect to a method of forming the roughenable cured resin layer (R layer), for example, a resin varnish in which the thermosetting resin composition already described has been dissolved in an appropriate organic solvent is prepared, and this resin varnish is coated on a peelable support film layer (C layer) as a support. The organic solvent is dried by heating, hot air blowing or the like to first form a thermosetting resin composition layer. The thermosetting resin composition of the film comprising the peelable support film layer (C layer) and the thermosetting resin composition layer is adhered to both surfaces or one surface of the heat-resistant film layer (A layer). The resulting film is heated to heat-cure the thermosetting resin composition layer and form the roughenable cured resin layer (B layer). The curing conditions vary with the components of the thermosetting resin composition. The curing temperature is usually selected from the range of from 100 to 200° C., and the curing temperature from the range of from 10 minutes to 15 hours. The curing which is performed by raising the temperature from a relatively low curing temperature to a high curing temperature is preferable to the curing which is not performed in this manner, in view of preventing occurrence of wrinkles or voids on the surface of the roughenable cured resin layer formed.

The thickness of B layer is from 5 to 20 μm, preferably from 7 to 15 μm. When the thickness of B layer is less than 5 μm, satisfactory formation of a roughened surface is difficult. Meanwhile, when it exceeds 20 μm, flexibility in using the layer in a flexible printed circuit board might be insufficient, warpage of a cured product layer in curing the resin composition might be increased, or a hole formation step might be difficult.

Examples of the organic solvent used in preparing the resin varnish of the thermosetting resin composition can include ketones such as acetone, methyl ethyl ketone and cyclohexanone, acetate esters such as ethyl acetate, butyl acetate, cellosolve acetate, propylene glycol monomethyl ether acetate and carbitol acetate, cellosolves such as cellosolve and butyl cellosolve, carbitols such as carbitol and butyl carbitol, aromatic hydrocarbons such as toluene and xylene, amides such as dimethylformamide, dimethylacetamide and N-methylpyrrolidone, and the like. Two or more of these organic solvents can also be used in combination.

The peelable support film in the invention plays a part of support material when forming the roughenable cured resin layer from the thermosetting resin composition, and also plays a part of preventing adhesion of a contaminant or the like to the roughenable cured resin layer in the heat curing.

As the peelable film used as the peelable support film layer (C layer), films of polyesters such as polyethylene terephthalate and polyethylene naphthalate, polycarbonates, a release paper and the like can be used. The thickness of the peelable support film is generally from 10 to 150 μm, preferably from 25 to 50 μm. Incidentally, the peelable support film may be subjected to mat treatment, corona treatment, release treatment or the like.

The peelable support film in the invention is preferably peeled after heat-curing the thermosetting resin composition to form the roughenable cured resin layer. The peelable support film is usually subjected to release treatment in advance.

After peeling the peelable support film, through-holes are formed, if necessary. When circuits are formed on both surfaces of the film, through-holes for connecting the circuits on both surfaces are usually formed. By the way, in case of a layer structure in which a copper foil is provided on one surface of the heat-resistant resin layer, blind vias may be formed from the side of the roughenable cured resin layer.

As a method of forming through-holes and blind vias, a method using a drill or a laser is mentioned. In view of forming holes having a smaller diameter, a laser is preferably used. Examples of the laser include a carbon dioxide gas laser, a UV-YAG laser, an excimer laser and the like. Especially, in case of a hole having a small diameter of less than 50 μm, a UV-YAG laser is preferable.

Examples of the oxidizing agent used to roughen the cured product surface and the inner wall of the through-hole or the blind via include an alkali permanganate solution, and solutions of oxidizing agents such as a bichromate, hydrogen peroxide, sulfuric acid and nitric acid. Especially, an alkali permanganate solution is preferable. Examples of the alkali permanganate solution can include a solution obtained by dissolving potassium permanganate or sodium permanganate in a sodium hydroxide aqueous solution.

Next, a method in which a conductor layer is formed on the surface of the insulation layer (roughenable cured resin layer) roughened and the inner wall of the through-hole or the via hole by plating and a circuit is formed on the surface of the insulation layer to form a circuit board, namely, a method of forming a circuit board using the film for a circuit board in the invention is described.

First, the surface of the roughenable cured resin layer is roughened with the oxidizing agent such as the alkali permanganate solution to form a roughened anchor. Subsequently, a conductor layer is formed by a method which is a combination of electroless plating and electroplating. Further, it is also possible that a plating resist having a pattern opposite to that of the conductor layer is formed and the conductor layer is formed by electroless plating alone. Incidentally, adhesion strength of the conductor layer can be improved and stabilized by annealing at from 150 to 200° C. for from 20 to 90 minutes after formation of the conductor layer. When the film for a circuit board in the invention has through-holes or blind vias having a diameter of, for example, less than 50 μm, the through-holes or blind vias can usually be filled with the conductor simultaneously with the formation of the conductor layer on the surface of the insulation layer by the plating step.

As a method of forming a circuit by pattern-processing the conductor layer, for example, a subtractive method and a semi-additive method which are known to a skilled person are available.

In case of the subtractive method, a thickness of a electroless copper-plated layer is from 0.1 to 3 μm, preferably from 0.3 to 2.0 μm. A copper-electroplated layer (panel plated layer) is formed thereon with a thickness of from 3 to 35 μm, preferably from 5 to 20 μm, and an etching resist is then formed. Etching is performed with an etching solution of ferric chloride, cupric chloride or the like to form a conductor pattern. Thereafter, the etching resist is removed to be able to obtain a circuit board. Further, in case of the semi-additive method, a electroless copper-plated layer is formed with a thickness of from 0.1 to 3 μm, preferably from 0.3 to 2.0 μm, and a pattern resist is then applied thereto to form a copper-electroplated layer (pattern plated layer) having a predetermined thickness (for example, from 9 to 18 μm). Thereafter, the pattern resist is removed to be able to obtain a circuit board. Especially, the semi-additive method is appropriate for fine circuit formation.

As the preferable layer structure of the film for a circuit board according to the invention, for example, the following layer structure examples 1 to 8 can be listed. Of these layer structure examples, layer structure examples 1 to 4 are examples in which the roughenable cured resin layers (B layers) are formed on both surfaces of the heat-resistant resin layer (A layer). Even when the roughening resin composition layers are formed on both surfaces of the heal-resistant resin layer, a conductor layer can be formed only on one surface. Incidentally, the roughenable cured resin layer (B layer) can be formed only on one surface. However, since warpage of the film tends to increase in forming the cured product layer, it is undesirable.

Moreover, as shown in layer structure examples 5 to 8, the roughenable cured resin layer is formed only on one surface of the heat-resistant resin layer, the cured resin layer (E layer) is formed on the remaining surface, and a copper foil is adhered to form a conductor layer. In this manner, the invention is optionally used in combination with the prior technique. Here, there is no need to roughen the cured resin layer (E layer). Accordingly, the resin composition used to form E layer is not required to be a resin composition capable of roughening in which the roughening component is incorporated as in B layer. However, B layer can be used also as E layer. As the resin composition used to form F layer, the foregoing thermosetting resin composition containing component (a) and component (b) and also known thermosetting compositions can be used. The copper foil (F layer) is not particularly limited, and those ordinarily used can be used. For example, a copper foil having a thickness of from 3 to 18 μm is available.

Layer Structure Example 1 roughenable cured resin layer (B layer)/heat-resistant resin layer (A layer)/roughenable cured resin layer (B layer), Layer Structure Example 2 peelable support film layer (C layer)/roughenable cured resin layer (B layer)/heat-resistant resin layer (A layer)/roughenable cured resin layer (B layer)/peelable support film layer (C layer), Layer Structure Example 3 electroless copper-plated layer (D1 layer)/roughenable cured resin layer (B layer)/heat-resistant resin layer (A layer)/roughenable cured resin layer (B layer)/electroless copper-plated layer (D1 layer), Layer Structure Example 4 copper-electroplated layer (D2 layer)/electroless copper-plated layer (D1 layer)/roughenable cured resin layer (B layer)/heat-resistant resin layer (A layer)/roughenable cured resin layer (B layer)/electroless copper-plated layer (D1 layer)/copper-electroplated layer (D2 layer), Layer Structure Example 5 roughenable cured resin layer (I3 layer)/heat-resistant resin layer (A layer)/cured resin layer (E layer)/copper foil (F layer), Layer Structure Example 6 peelable support film layer (C layer)/roughenable cured resin layer (B layer)/heat-resistant resin layer (A layer)/cured resin layer (E layer)/copper foil (F layer), Layer Structure Example 7 electroless copper-plated layer (D1 layer)/roughenable cured resin layer (B layer)/heat-resistant resin layer (A layer)/cured resin layer (E layer)/copper foil (F layer), and Layer Structure Example 8 copper-electroplated layer (D2 layer)/electroless copper-plated layer (D1 layer)/roughenable cured resin layer (B layer)/heat-resistant resin layer (A layer)/cured resin layer (E layer)/copper foil (F layer).

EXAMPLES

Having generally described this invention, a further understanding can be obtained by reference to certain specific examples which are provided herein for purposes of illustration only and are not intended to be limiting unless otherwise specified. The the following Examples, part(s) means part(s) by weight.

Example 1

20 parts of a bisphenol A-type epoxy resin "Epikote 828" (epoxy equivalent 190, manufactured by Japan Epoxy Resins Co., Ltd.) and 35 parts of a cresol novolak-type epoxy resin "Epiclon N-673" (epoxy equivalent 215, softening point 78° C., manufactured by Dainippon Ink and Chemicals, Inc.) were heat-dissolved in 2-butanone while being stirred, and the solution was then cooled to room temperature. Subsequently, 45 parts of a 2-butanone solution of a triazine structure-containing phenolic novolak resin, "Phenolite LA-7052 (nonvolatile content 60%, nonvolatile content phenolic hydroxyl group equivalent 120, manufactured by Dainippon Ink and Chemicals, Inc.), 70 parts of a cyclohexanone solution of a phenoxy resin "YL-6746H30" (nonvolatile content 30% by weight, weight average molecular weight 30,000, manufactured by Japan Epoxy Resins Co., Ltd.) comprising a bixylenol-type epoxy resin "Epikote YX-4000" (epoxy equivalent 185, manufactured by Japan Epoxy Resins Co., Ltd.) and bisphenol S, further 18 parts of spherical silica and 2 parts of pulverized silica were added to prepare a resin varnish of a thermosetting resin composition. This varnish type thermosetting resin composition was coated on a release-treated surface of a polyethylene naphthalate film having a thickness of 38 μm, and dried at from 80 to 120° C. (on average 100° C.) (residual amount of the solvent 2% by weight) to form a thermosetting resin composition layer having a film thickness of 10 μm. This layer was wound up in the form of a roll.

Then, the surfaces of the thermosetting resin compositions having the thickness of 10 μm were adhered to both surfaces of a polyimide film "Kapton EN" (both surfaces plasma-treated, manufactured by Du Pant-Toray Co., Ltd.) having a thickness of 25 μm at the same time, and wound up in the form of a roll. The curing temperature was then raised from a low temperature to a high temperature. That is, the resulting product was cured at 120° C. for 30 minutes and then at 170° C. for 30 minutes.

The layer structure of the resulting film for a (flexible) circuit board is polyethylene naphthalate film(peelable support film (C layer))/roughen-able cured resin layer (B layer)/polyimide film (heat-resistant resin layer (A layer)/roughenable cured resin layer (B layer)/polyethylene naphthalate film (peelable support film (C layer)).

Example 2

50 parts of a brominated bisphenol-type epoxy resin "YDB-500'" (epoxy equivalent 500, manufactured by Tohto Kasei Co., Ltd.), 20 parts of a cresol novolak-type epoxy resin "Epiclon N-67 3" (epoxy equivalent 215, softening point 78° C., manufactured by Dainippon Ink and Chemicals, Inc.) and 15 parts of a terminal-epoxidized butadiene rubber "Denalex R-45 EPT" (manufactured by Nagase Chemicals, Ltd.) are heat-dissolved in a 2-butanone/toluene mixed solvent while being stirred. To the solution is added 4 parts of 2,4-diamino-6-(2-methyl-limidazolyl)ethyl-1,3,5-triazine as an epoxy curing agent. Further, 2 parts of pulverizing silica and 10 parts of calcium carbonate are added to form a resin varnish of a thermosetting resin composition. The varnish of the thermosetting resin composition is coated on a release-treated surface of a polyethylene terephthalate film having a thickness of 25 μm, and dried at from 80 to 120° C. (on average 100° C.) (residual amount of the solvent approximately 2% by weight) to form a thermosetting resin composition layer having a film thickness of 10 μm which is then wound up in the form of a roll.

Subsequently, the surface of the thermosetting resin composition having the thickness of 10 μm is adhered to one surface of a polyimide film "Apical HP" (both surfaces corona-discharged, manufactured by Kaneka Corporation) having a thickness of 12.5 μm, and the product is wound up in the form of a roll. This is cured at 120° C. for 8 hours and then at 150° C. for 4 hours.

The layer structure of the resulting film for a (flexible) circuit board is polyethylene terephthalate film (peelable support film (C layer))/roughenable cured resin layer (B layer)/polyimide film (heat-resistant resin layer (A layer)).

Example 3

The polyethylene naphthalate film (peelable support film layer) was peeled from the film obtained in Example 1 to expose the roughenable cured resin layer. This layer was dipped in a swelling solution "Swelling Dip Securiganth P" (manufactured by Atotech Japan K. K.) at 80° C. for 5 minutes to swell the surface of the roughenable cured resin layer which was then roughened by being dipped in an alkali manganese solution at 80° C. for 10 minutes. Thereafter, manganese remaining on the surface of the roughenable cured resin layer was reductively removed.

Subsequently, a catalyst for electroless copper plating was applied, and the resulting product was then dipped in a electroless copper-plating solution at 32° C. for 30 minutes to form a electroless copper-plated coat of 1.5 μm. The film was dried at 120° C. for 30 minutes.

The layer structure of the resulting film for a (flexible) circuit board is electroless copper-plated layer (D1 layer)/roughenable cured resin layer (B layer)/polyimide film (heat-resistant resin layer (A layer)/roughenable cured resin layer (B layer)/electroless copper-plated layer (D1 layer).

After the resulting film was washed with an acid, electroplating copper was performed at a cathode current density of 2.0 A/dm2 for 12 minutes using a phosphorus-containing copper plate as an anode to form a copper-plated coat having a thickness of 5 μm, and the film was annealed at 170° C. for 60 minutes.

The layer structure of the resulting film for a (flexible) circuit board is copper-electroplated layer (D2 layer)/electroless copper-plated layer (D1 layer)/roughenable cured resin layer (B layer)/polyimide film (heat-resistant layer (A layer))/roughenable cured resin layer (B layer)/electroless copper-plated layer (D1 layer)/copper-electroplated layer (D2 layer). The adhesion strength of the plated coat was 0.7 kg/cm.

Example 4

The polyethylene naphthalene film (peelable support film layer) is peeled from the film obtained in Example 2 to expose the roughenable cured resin layer. This layer is dipped in a swelling agent "Swelling Dip Securiganth P" (manufactured by Atotech Japan K.K.) at 80° C. for 5 minutes to swell the surface of the roughenable cured resin layer which is then roughened by being dipped in an alkali manganese solution at 80° C. for 10 minutes. Thereafter, manganese remaining on the surface of the roughenable cured resin layer is reductively removed.

Subsequently, a catalyst for electroless copper plating is applied, and the resulting product is dipped in a electroless copper-plating solution at 32° C. for 15 minutes to form a electroless copper-plated coat of 0.8 μm which is then dried at 120° C. for 30 minutes.

The layer structure of the resulting film for a (flexible) circuit board is electroless copper-plated layer (D1 layer)/roughenable cured resin layer (B layer)/polyimide film (heat-resistant resin layer (A layer)).

After the resulting film is washed with an acid, electroplating copper is performed at a cathode current density of 2.0 A/dm2 for 20 minutes using a phosphorus-containing copper plate as an anode to form a copper-plated coat having a thickness of 8 μm, and the film is annealed at 170° C. for 60 minutes.

The layer structure of the resulting film for a (flexible) circuit board is copper-electroplated layer (D2 layer)/electroless copper-plated layer (D1 layer)/roughenable cured resin layer (B layer)/polyimide film (heat-resistant resin layer (A layer)).

Example 5

The polyethylene naphthalate film (peelable support film layer) was peeled from the film obtained in Example 1 to expose the roughenable cured resin layer. After via holes having a diameter of 30 μm were formed with UV-YAG laser, this layer was dipped in a swelling solution "Swelling Dip Securiganth P" (manufactured by Atotech Japan K.K.) at 80° C. for 5 minutes to swell the surface of the roughenable cured resin layer which was then roughened by being dipped in an alkali manganate solution at 80° C. for 10 minutes. Thereafter, manganese remaining on the surface of the roughenable cured resin layer was reductively removed.

Subsequently, a catalyst for electroless copper plating was applied, and the resulting product was then dipped in a electroless copper-plating solution at 32° C. for 30 minutes to form a electroless copper-plated coat of 1.5 dim which was then dried at 120° C. for 30 minutes.

The layer structure of the resulting film for a (flexible) circuit board is electroless copper-plated layer (D1 layer)/roughenable cured resin layer (B layer)/polyimide film (heat-resistant resin layer (A layer))/roughenable cured resin layer (B layer)/electroless copper-plated layer (D1 layer).

After the resulting film was washed with an acid, electroplating copper was performed at a cathode current density of 2.0 A/dm2 for 12 minutes using a phosphorus-containing copper plate as an anode to form a copper-plated coat having a thickness of 5 μm, and the film was annealed at 170° C. for 60 minutes.

The layer structure of the resulting film for a (flexible) circuit board is copper-electroplated layer (D2 layer)/electroless copper-plated layer (D1 layer)/roughenable cured resin layer (B layer)/polyimide film (heat-resistant layer (A layer) )/roughenable cured resin layer (B layer)/electroless copper-plated layer (D1 layer)/copper-electroplated layer (D2 layer). The adhesion strength of the plated coat was 0.7 kg/cm.

Example 6

The same resin varnish of the thermosetting resin composition as in Example 1 was used, coated on a mat surface of a copper foil having a thickness of 18 μm, and dried at from 80 to 120° C. (on average 100° C.) (residual amount of the solvent 1.8% by weight) to form a thermosetting resin composition layer at a film thickness of 10 μm, and an aramid film "Aramica" (both surfaces plasma-treated, manufactured by Asahi Kasei Corporation) having a of 4.5 μm was laminated on the thermosetting resin composition layer. The laminate was then wound up in the form of a roll. At this time, the layer structure of the film is aramid film (heat-resistant resin layer (A layer))/cured resin layer (E layer)/copper foil (F layer).

Subsequently, the same resin varnish of the thermosetting resin composition as in Example 1 was used, and coated on a release-treated surface of a polyethylene terephthalate film having a thickness of 38 μm. The resulting product was dried at from 80 to 120° C. (on average 100° C.) (residual amount of the solvent 2.0% by weight) to form a thermosetting resin composition layer at a film thickness of 10 μm. The aramid film surface of the film having the layer structure of aramid film (heat-resistant resin layer (A layer))/cured resin layer (E layer)/copper foil (F layer) produced previously as mentioned above was laminated on this thermosetting resin composition layer, and the laminate was wound up in the form of a roll. The curing temperature was raised from a low temperature to a high temperature, that is, the product was cured at 100° C. for 2 hours and then at 150° C. for 1 hour.

The layer structure of the resulting film for a (flexible) circuit board is polyethylene terephthalate film (peelable support film (C layer))/roughenable cured resin layer (B layer)/aramid film (heat-resistant resin layer (A layer))/cured resin layer (E layer)/copper foil (F layer).

In this Example, the same resin varnish of the thermosetting resin composition is used in the roughenable cured resin layer (B layer) and the cured resin layer (E layer).

Example 7

The polyethylene naphthalate film (peelable support film layer) was peeled from the film obtained in Example 6 to expose the roughenable cured resin layer. After blind via holes having a diameter of 25 μm were formed with UV-YAG laser, this layer was dipped in a swelling solution "Swelling Dip Securiganth P" (manufactured by Atotech Japan K. K.) at 60° C. for 5 minutes to swell the surface of the roughenable cured resin layer which was then roughened by being dipped in an alkali manganate solution at 80° C. for 10 minutes. Thereafter, manganese remaining on the surface of the roughenable cured resin layer was reductively removed.

Subsequently, a catalyst for electroless copper plating was applied, and the resulting product was then dipped in an electroless copper-plating solution at 32° C. for 30 minutes to form a electroless copper-plated coat of 1.5 μm which was then dried at 120° C. for 30 minutes.

The layer structure of the resulting film for a (flexible) circuit: board is electroless copper-plated layer (D1 layer)/roughenable cured resin layer (B layer)/aramid film (heat-resistant resin layer (A layer))/cured resin layer (E layer)/copper foil (F layer).

After the resulting film was washed with an acid, electroplating copper was performed at a cathode current density of 2.0 A/dm$^2$ for 30 minutes using a phosphorus-containing copper plate as an anode to form a copper-plated coat having a thickness of 12 μm, and the film was annealed at 170° C. for 60 minutes.

The layer structure of the resulting film for a (flexible) circuit board is copper-electroplated layer (D2 layer)/electroless copper-plated layer (D1 layer)/roughenable cured resin layer (B layer)/aramid film (heat-resistant layer (A layer))/cured resin layer (E layer)/copper foil (F layer). The adhesion strength of the plated coat was 0.75 kg/cm.

Comparative Example 1

The adhesion strength of a plated coat of commercially available "S'PERFLEX" (manufactured by Sumitomo Metal Mining Co., Ltd.) obtained by forming an Ni seed layer. on a polyimide film "Kapton EN" of 25 μm through sputtering and conducting copper plating (8 μm) was 0.5 kg/cm.

Obviously, numerous modifications and variations of the present invention are possible in light of the above teachings. It is therefore to be understood that within the scope of the appended claims, the invention may be practiced otherwise than as specifically described herein.

The invention claimed is:

1. A film for a circuit board, wherein the following A layer is adjacent to the following B layer,
wherein
the A layer is a heat-resistant resin layer with a thickness of from 2 to 250 μm which is made of a heat-resistant resin having a glass transition point of 200° C. or more or a decomposition temperature of 300° C. or more, and
the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent.

2. A film for a circuit board, wherein the film comprises the following A layer, B layer and C layer, and has a layer structure in the order of C layer, B layer and A layer,
wherein
the A layer is a heat-resistant resin layer with a thickness of from 2 to 250 μm which is made of a heat-resistant resin having a glass transition point of 200° C. or more or a decomposition temperature of 300° C. or more,
the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, and
the C layer is a peelable support film.

3. A film for a circuit board, wherein the film comprises the following A layer, B layer and D layer, and has a layer structure in the order of D layer, B layer and A layer,
wherein
the A layer is a heat-resistant resin layer with a thickness of from 2 to 250 μm which is made of a heat-resistant resin having a glass transition point of 200° C. or more or a decomposition temperature of 300° C. or more,
the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, and
the D layer is a conductor layer.

4. The film for a circuit board as claimed in claim 3, wherein the conductor layer is an electroless copper-plated layer (D1 layer).

5. The film for a circuit board as claimed in claim 3, wherein the conductor layer comprises an electroless copper-plated layer (D1 layer) and a copper-electroplated layer (D2 layer).

6. A film for a circuit board, wherein the film comprises the following A layer, B layer and C layer, and has a layer structure in the order of C layer, B layer, A layer, B layer and C layer,
wherein
the A layer is a heat-resistant resin layer with a thickness of from 2 to 250 μm which is made of a heat-resistant resin having a glass transition point of 200° C. or more or a decomposition temperature of 300° C. or more,
the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, and
the C layer is a peelable support film.

7. A film for a circuit board, wherein the film comprises the following A layer, B layer and D layer and has a layer structure in the order of D layer, B layer, A layer, B layer and D layer,
wherein
the A layer is a heat-resistant resin layer with a thickness of from 2 to 250 μm which is made of a heat-resistant resin having a glass transition point of 200° C. or more or a decomposition temperature of 300° C. or more,
the B layer is a roughenable cured resin layer with a thickness of from 5 to 20 μm which layer is made of a cured product of a thermosetting resin composition containing at least component (a) of an epoxy resin having two or more epoxy groups in a molecule and component (b) of an epoxy curing agent, wherein the cured product is capable of being roughened with an oxidizing agent, and
the D layer is a conductor layer.

8. The film for a circuit board as claimed in claim 7, wherein the conductor layer is an electroless copper-plated layer (D1 layer).

9. The film for a circuit board as claimed in claim 7, wherein the conductor layer comprises an electroless copper-plated layer (DI layer) and a copper-electroplated layer (D2 layer).

10. A film for a circuit board, wherein the film comprises the following A layer, B layer, C layer, E layer and F layer, and has a layer structure in the order of C layer, B layer, A layer, E layer and F layer,
wherein
the A layer is a heat-resistant resin layer with a thickness of from 2 to 250 μm which is made of a heat-resistant resin having a glass transition point of 200° C. or more or a decomposition temperature of 300° C. or more,
the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent,
the C layer is a peelable support film,
the E layer is a cured resin layer with a thickness of from 5 to 20 μm which is made of a cured product of a thermosetting resin composition containing at least component (a) of an epoxy resin having two or more epoxy groups in a molecule and component (b) of an epoxy curing agent, and
the F layer is a copper foil.

11. A film for a circuit board, wherein the film comprises the following A layer, B layer, D layer, E layer and F layer, and has a layer structure in the order of D layer, B layer, A layer, E layer and F layer,
wherein
the A layer is a heat-resistant resin layer with a thickness of from 2 to 250 μm which is made of a heat-resistant resin having a glass transition point of 200° C. or more or a decomposition temperature of 300° C. or more,
the B layer is a roughenable cured resin layer with a thickness of from 5 to 20 μm which is made of a cured product of a thermosetting resin composition containing at least component (a) of an epoxy resin having two or more epoxy groups in a molecule and component (b) of an epoxy curing agent, wherein the cured product is capable of being roughened with an oxidizing agent,
the D layer is a conductor layer,
the E layer is a cured resin layer with a thickness of from 5 to 20 μm which is made of a cured product of a thermosetting resin composition containing at least component (a) of an epoxy resin having two or more epoxy groups in a molecule and component (b) of an epoxy curing agent, and
the F layer is a copper foil.

12. The film for a circuit board as claimed in claim 11, wherein the conductor layer (D layer) is an electroless copper-plated layer (D1 layer).

13. The film for a circuit board as claimed in claim 11, wherein the conductor layer (D layer) comprises an electroless copper-plated layer (D1 layer) and a copper-electroplated layer (D2 layer).

14. A circuit board produced using the film for a circuit board as claimed in any of claims 1 to 13.

15. A circuit board, which comprises the following A layer, B layer and D layer, and has a layer structure in the order of the D layer, B layer and A layer,
wherein
the A layer is a heat-resistant resin layer with a thickness of from 2 to 250 μm which is made of a heat-resistant resin having a glass transition point of 200° C. or more or a decomposition temperature of 300° C. or more,
the B layer is a roughened cured resin layer with a thickness of from 5 to 20 μm which is made of a cured product of a thermosetting resin composition containing at least component (a) of an epoxy resin having two or more epoxy groups in a molecule and component (b) of an epoxy curing agent, and
the D layer is a conductor layer.

16. A method of making a circuit board, comprising:
roughening the roughenable cured resin layer (the B layer) of the film according to claim 1, and
forming a conductor layer on the resulting roughened roughenable cured resin layer.

17. A method of making a circuit board, comprising:
roughening the roughenable cured resin layer (the B layer) of the film according to claim 2, and
forming a conductor layer on the resulting roughened roughenable cured resin layer.

18. A method of making a circuit board, comprising:
roughening the roughenable cured resin layer (the B layer) of the film according to claim 3, and
forming a conductor layer on the resulting roughened roughenable cured resin layer.

19. A method of making a circuit board, comprising:
roughening the roughenable cured resin layer (the B layer) of the film according to claim 6, and
forming a conductor layer on the resulting roughened roughenable cured resin layer.

20. A method of making a circuit board, comprising:
roughening the roughenable cured resin layer (the B layer) of the film according to claim 7, and
forming a conductor layer on the resulting roughened roughenable cured resin layer.

21. A method of making a circuit board, comprising:
roughening the roughenable cured resin layer (the B layer) of the film according to claim 10, and
forming a conductor layer on the resulting roughened roughenable cured resin layer.

22. A method of making a circuit board, comprising:
roughening the roughenable cured resin layer (the B layer) of the film according to claim 11, and
forming a conductor layer on the resulting roughened roughenable cured resin layer.

* * * * *